(12) United States Patent
Pendurkar et al.

(10) Patent No.: US 6,629,275 B1
(45) Date of Patent: Sep. 30, 2003

(54) REINSTATE APPARATUS AND METHOD TO RECREATE DATA BACKGROUND FOR TESTING SRAM

(75) Inventors: Rahesh Y Pendurkar, Sunnyvale, CA (US); Amit D. Sanghani, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/513,662

(22) Filed: Feb. 25, 2000

(51) Int. Cl.[7] .......................... G01R 31/28; G11C 29/00
(52) U.S. Cl. ........................................ 714/726; 714/720
(58) Field of Search .............................. 714/720, 726; 365/236

(56) References Cited

U.S. PATENT DOCUMENTS

| | | | |
|---|---|---|---|
| 5,604,756 A | | 2/1997 | Kawata ..................... 714/773 |
| 5,729,553 A | * | 3/1998 | Motohara ................... 714/726 |
| 5,958,076 A | * | 9/1999 | Kishi .......................... 714/726 |
| 6,260,164 B1 | * | 7/2001 | Aipperspach et al. ....... 714/726 |

* cited by examiner

*Primary Examiner*—Albert Decady
*Assistant Examiner*—Shelly A Chase
(74) *Attorney, Agent, or Firm*—Martine & Penilla, LLP

(57) ABSTRACT

A system for recreating a data background to test memory designs for macros includes a macro, a first multiplexer, and a second multiplexer. The macro includes a plurality of flip-flops. The first multiplexer has a first input coupled to the macro output and a second input coupled to an inverted version of the macro output. The first multiplexer receives a control signal that selects between the macro output and the inverted version of such output to produce a first multiplexer output. A second multiplexer, coupled to the first multiplexer output and a normal scan input signal, receives a select signal that selects between the first multiplexer output and the normal scan input signal to generate a second multiplexer output, which is coupled to the macro input. A method for recreating a data background to test memory designs for a macro size defined by a plurality of flip-flops also is described.

14 Claims, 3 Drawing Sheets

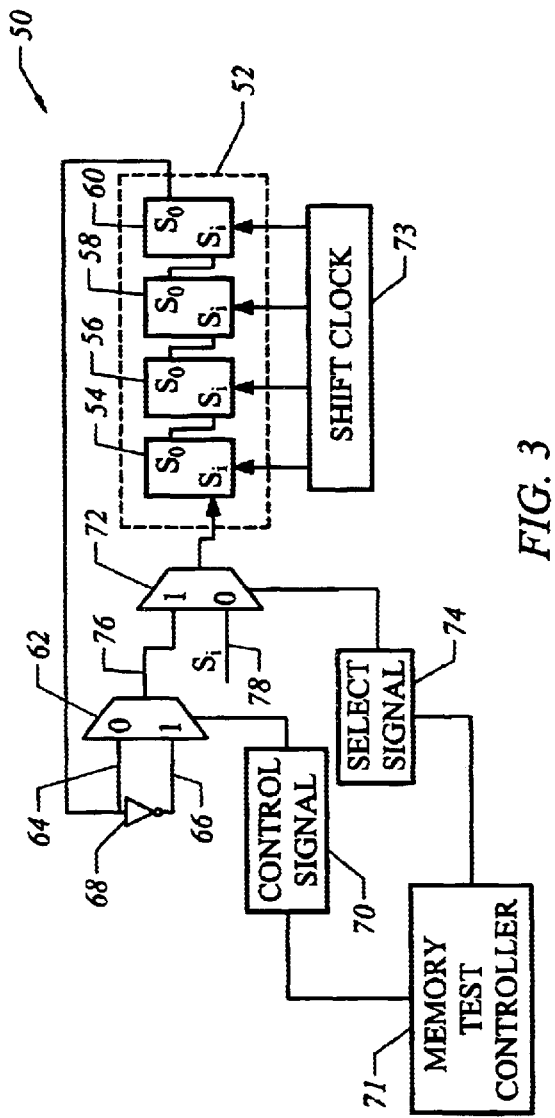
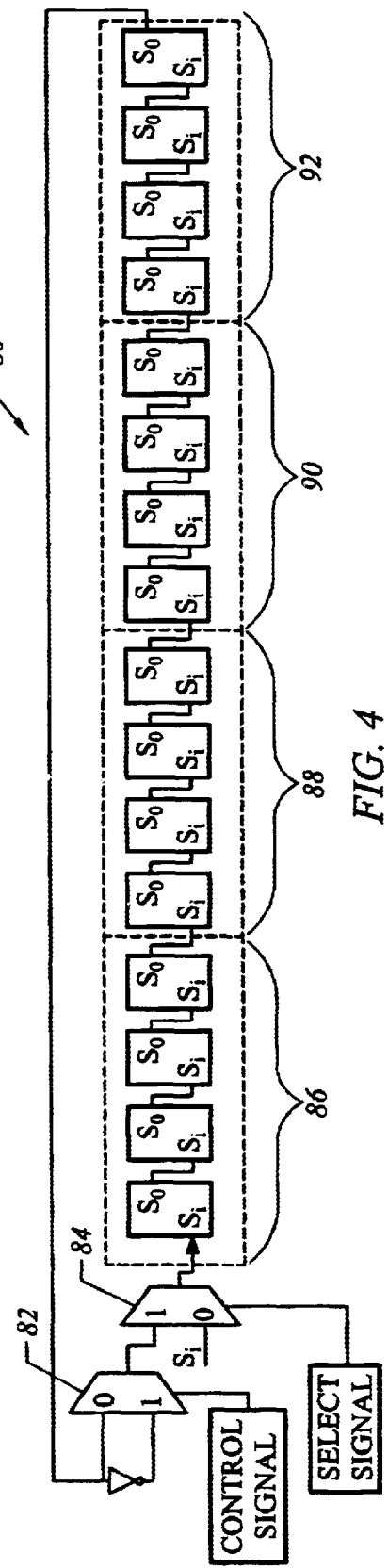

REINSTATE APPARATUS AND METHOD TO RECREATE DATA BACKGROUND FOR TESTING SRAM

BACKGROUND OF THE INVENTION

1. Field of the Invention

The present invention relates to recreating a data background to test memory designs. More particularly, the present invention relates to an apparatus and method to test and recreate a data background while testing Static Random Access Memory (SRAM) in a scan based mode with a control system.

2. The Background Art

Memory test algorithms are used to perform high performance test algorithms for SRAM components. More particularly, a variety of methods such as a 2N, 6N or 12N march test algorithm are used to test SRAM components. The 6N march test algorithm uses a specific data background and the complement of the specific data background in a read/write manner which is described here in further detail below.

The 6N march test algorithm is used to test internal RAM data integrity at the CPU manufacturing and debug stage and for field testing and diagnostic testing. The 6N march test consists of six(6) read/write cycles which are accomplished in three passes. Those with ordinary skill in the art will appreciate the six read/write operations identified as:

$$\uparrow W_0, \uparrow (R_0 W_1), \downarrow (R_1 W_0 R_0)$$

The first operation ($\uparrow W_0$) initializes the memory array by writing a particular data patterns of ones and zeros from lower to higher memory addresses.

The second operation $\uparrow (R_0 W_1)$ starts from the lower address and reads back the data background deposited in the first pass and writes the complement of the data background to the same location. The complement of the data background verifies that all cells containing a one can store a zero and vice versa.

The third operation $\downarrow (R_1 W_0 R_0)$ starts from the higher memory address and reads back the complemented background data deposited in the third operation. After each location is read and verified, the original data is written back to the same memory locations. The operation is concluded by reading back the original background data from the same memory location addresses and verifying the contents of each location.

The 6N test algorithm provides a diagnostic tool for determining memory failure. When performing the 6N test algorithm, the timing for writing the test data background is determined by a scan clock signal which does not operate at the CPU operating speed. By way of example, for a 400 MHz processor, the scan clock generally operates at 50 MHz. The slower scan clock cycle presents a substantial limitation because speed related faults in the SRAM are not tested at its operating speed. Therefore, it would be beneficial to provide a memory test algorithm which can operate at the same clock cycle as the CPU.

Referring to FIG. 1, there is shown a block diagram of a prior art testing system 10 having one input data register 12 which is scannable and used for storing data to be written into SRAM 14. The prior art teaches the use of a single input register 12 in conjunction with the memory test algorithm for conducting SRAM diagnostic testing. The initial data background from the single input register is written into each data line of the SRAM 14. The input data register 12 may be comprised of a plurality of flip-flops and/or macros. A macro comprises a plurality of flip-flops. After the initial data background is written into the data line, the $\uparrow W_0$ operation is completed. The complement of the $\uparrow W_0$ operation, i.e. $\uparrow W_1$, is generated by inverting the initial data background (not shown) and scanning in the inverted data background to the single input register. The operation of the prior art testing apparatus requires special pins (not shown) which can be controlled from an external tester. Since the prior art testing apparatus requires an external tester, the prior art memory test application is limited by tester clock speed.

Referring to FIG. 2, there is shown a block diagram of a prior art testing system 20 having two input data registers 22 and 24 which are written into the SRAM 26. The first input data register 22 and second input data 24 register generate the data background associated with the write operations, $\uparrow W_0$ and $\uparrow W_1$, respectively. In operation, the first and second input data registers are then written into the data lines of the SRAM as determined by the 6N memory test algorithm described above. The input data registers for the memory test algorithm may be located on the SRAM 26 itself or in close proximity of the SRAM. Although having two input data registers speeds up the testing algorithm because the complement does not have to be generated, the use of two input registers occupies valuable CPU space.

A "macro" is comprised of a plurality of embedded flip-flops. More particularly, the macro has a scan-in port and scan-out port accessible to the CPU only at the macro boundary flip-flops. By way of example and not of limitation, a macro may consist of four embedded flip-flops which are serially coupled. The first flip-flop would have a scan-in port that is accessible by other components and the fourth flip-flop would have a scan-out port that is accessible by other components. The internal coupling of flops one to four would not be accessible to outside components. The internal coupling for the four flop macro is accomplished by coupling the first flip-flop scan-out port to a scan-in port of a second flip-flop, coupling the second flip-flop scan-out port to the scan-in port of a third flip-flop, coupling the third flip-flop scan-out port to the scan-in port of the fourth flip flop. As previously mentioned, the internal coupling of flops one to four would not be accessible to outside components.

It shall be appreciated by those skilled in the art, that each flip-flop within the macro has receives an associated clocking signal. The clocking signal for each flip flop is determined by a clock controller. The ability to control the clocking signal within each flip-flop with a clock controller is well known in the art.

Macros are predesigned and optimized to improve timing in the CPU. By way of example and not of limitation, a macro may include 4 to 16 flip-flops. If an input data register consists of macros instead of individual flops, the recreation of a data background by feeding the same state back into the individual flip flop is not possible. The inability to feed the same state back to the individual flops in the macro is because there are no scan-in or scan-out ports for flip flops embedded inside the macro.

It would therefore be beneficial to provide an apparatus and method which can recreate a data background for an input register comprising of macro elements in a scan based memory test.

SUMMARY OF THE INVENTION

The present invention provides a system and method for re-creating a data background to test memory designs. The system comprises a macro, a first 2-to-1 multiplexer and a second 2-to-1 multiplexer. The macro has an input and output. The first multiplexer is coupled to the macro output and coupled to an inverter which resides between the two first multiplexer inputs. The inverter generates an inverted macro output when enabled. The first 2-to-1 multiplexer receives a control signal which selects the macro output or the inverted macro output to produce a generate a first 2-to-1 multiplexer output. The second multiplexer is coupled to the first mulitplexer output and a normal scan input. The second 2-to-1 multiplexer also receives a select signal which selects between the first multiplexer output and the normal scan input to generate a second 2-to-1 mulitplexer output which is coupled to the macro input.

The present invention also provides a method for recreating a data background to test memory designs for a macro size defined by a plurality of flip-flops. First the macro is initialized with a normal scan input. Selection is then made between a normal shift or an inverted shift. Next, either the normal shift or the inverted shift is performed. The memory is then shifted within the flip-flops according to clocking signals of a shift clock. The number of clocking signals is then compared with the macro size. Finally, the selection between a normal shift or an inverted shift is repeated until the number of clocking signals equals the macro size.

BRIEF DESCRIPTION OF THE DRAWINGS

FIG. 3 is a block diagram of the present invention having one macro.

FIG. 4 is a block diagram of the present invention having four macros.

DETAILED DESCRIPTION OF THE INVENTION

Figure 1:
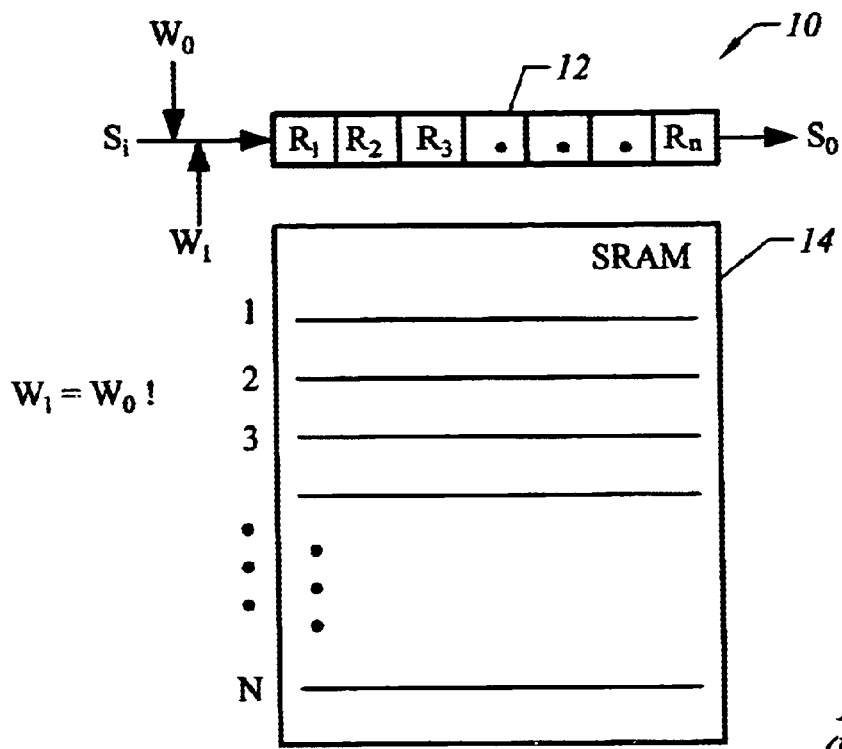
FIG. 1 is a block diagram of a prior art testing apparatus having one input data register which is scanned into SRAM.
Figure 2:
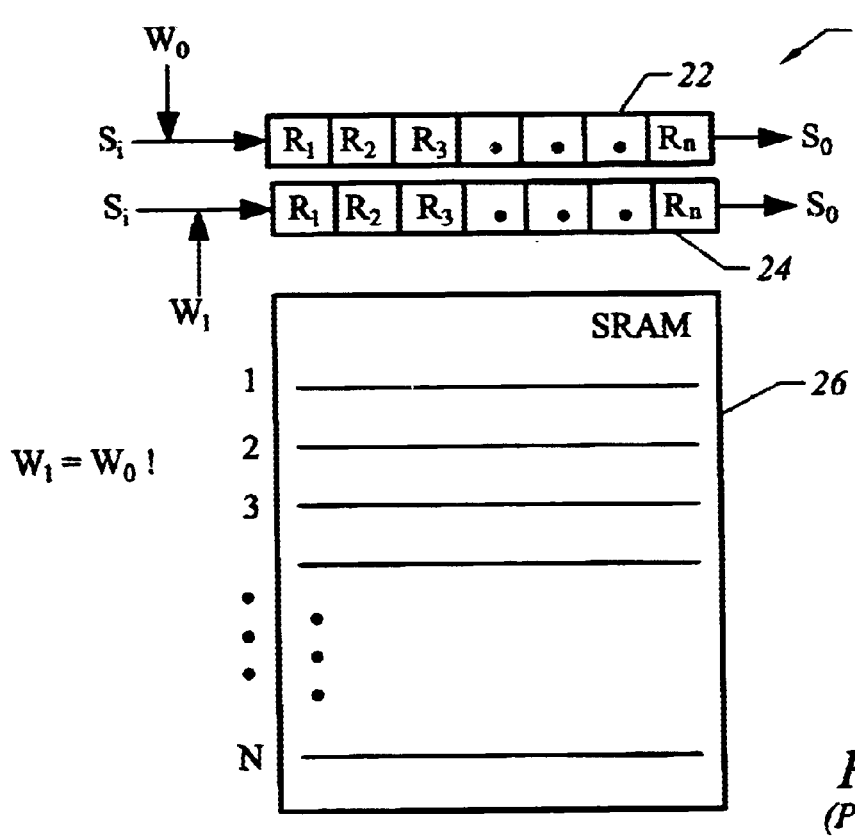
FIG. 2 is a block diagram of a prior art testing apparatus having two input data registers which are scanned into the SRAM.

Those of ordinary skill in the art will realize that the following description of the present invention is illustrative only and not in any way limiting. Other embodiments of the invention will readily suggest themselves to such skilled persons having the benefit of this disclosure.

Referring to FIG. 3 there is shown a block diagram of the present system with one macro comprising four flip flops. The present invention is a system to test SRAMs using a classical 6N march test algorithm. As previously described, in this memory test algorithm, a data background and its complement is 'written to' and 'read from' all the registers in a memory locations in a particular order.

The present system 50 includes a fixed size macro 52. The fixed size macro 52 is comprised of four flip flops 54, 56, 58, and 60. The macro size for this embodiment is defined by the number of flip flops, namely four. Each flip flop has a scan-in (Si) port and a scan-out (So) port. The scan-out port of the macro 52 is coupled to a first 2-to-1 multiplexer 62. The first 2-to-1 multiplexer 62 is enabled during the test mode. The first 2-to-1 multiplexer 62 includes a first input 64 and a second input 66. An inverter 68 is coupled between the first input 64 and the second input 66. A control signal 70 generated by a memory test controller 71 is fed to the first multiplexer 62. The control signal 70 governs whether the same data background or its complement is re-generated. The output from the first multiplexer 62 is then fed to a second 2-to-1 multiplexer 72. Additionally, a shift clock 73 generates clocking signals which are communicated to flip flops 54, 56, 58 and 60 of the macro 52. The shift clock is a clock generator which is well known in the art, and performs the function of shifting a data background through each of the flip-flops.

The second 2-to-1 multiplexer 72 receives two inputs and a select signal 74. The first input 76 is the test mode output generated by the first multiplexer 62. The second input 78 is generated from the normal scan mode. The select signal 74, generated by the memory test controller 71, toggles between normal scan mode or test mode. The output of the second multiplexer 72 is fed into the scan input of the first flip flop 54 of the macro 52.

It shall be appreciated by those skilled in the art that the memory test controller 71 generates the signals to drive the multiplexers to implement the various memory test algorithm functions. As will be appreciated by such skilled persons, the output from the memory test controller will depend on the memory test algorithm, memory size and other factors. The memory test controller regulates the control signal 70 and select signal 74. The memory test controller is located on the CPU block (not shown). Memory test controllers are well known in the art and can be readily adapted to the present invention by those persons of ordinary skill in the art once the particular memory size, test algorithm, etc. are chosen.

The fundamental principle behind the data background reinstate system and method of the present invention is that with the select signal 74 enabling the test mode, either the same data background or inverted data background can be reinstated into the macro. Additionally, the number of scan clocks is equal to the size of the macro. The total number of times the normal or inverted shift is performed should be equal to the number of flip-flops in the macro. This ensures the recreation of the normal or inverted data background.

Therefore, the advantage of the present system is that during a test mode, the testing hardware overhead is reduced significantly. The basis for the reduced overhead is that the two registers, previously needed to accomplish the 6N march algorithm are no longer necessary.

Referring to FIG. 4 there is shown a block diagram of an alternative system 80 having four macros. The alternative system comprises a first 2-to-1 multiplexer 82 and a second 2-1 multiplexer 84. The first 2-to-1 multiplexer 82 is coupled to the scan out port of a macro and has an inverter operatively coupled between the inputs to the first 2-to-1 multiplexer 82. The control signal is submitted to the multiplexer 82 to control the data background that is regenerated during the memory test algorithm.

The second 2-to-1 multiplexer 84 receives a first input which is the test mode output generated by the first multiplexer 82. The second input to the second 2-to-1 multiplexer 84 is generated during the normal scan mode. The select signal provides the function of toggling between the scan input of the first flip flop 82. The output from the second multiplexer 84 is submitted to a first macro 86.

The first macro 86 is coupled to a second macro 88. The second macro 88 is coupled to a third macro 90. The third macro is coupled to a fourth macro 92. Each macro is further comprised of four flip flops in which each flip flop has a scan-in (Si) and scan-out (So) port. With exception to the number of macros, the four macro embodiment of FIG. 4 is configured in the same manner as the single macro embodiment of FIG. 3. The macro size for this embodiment is again defined by the total number of flip-flops which is sixteen.

Figure 5:
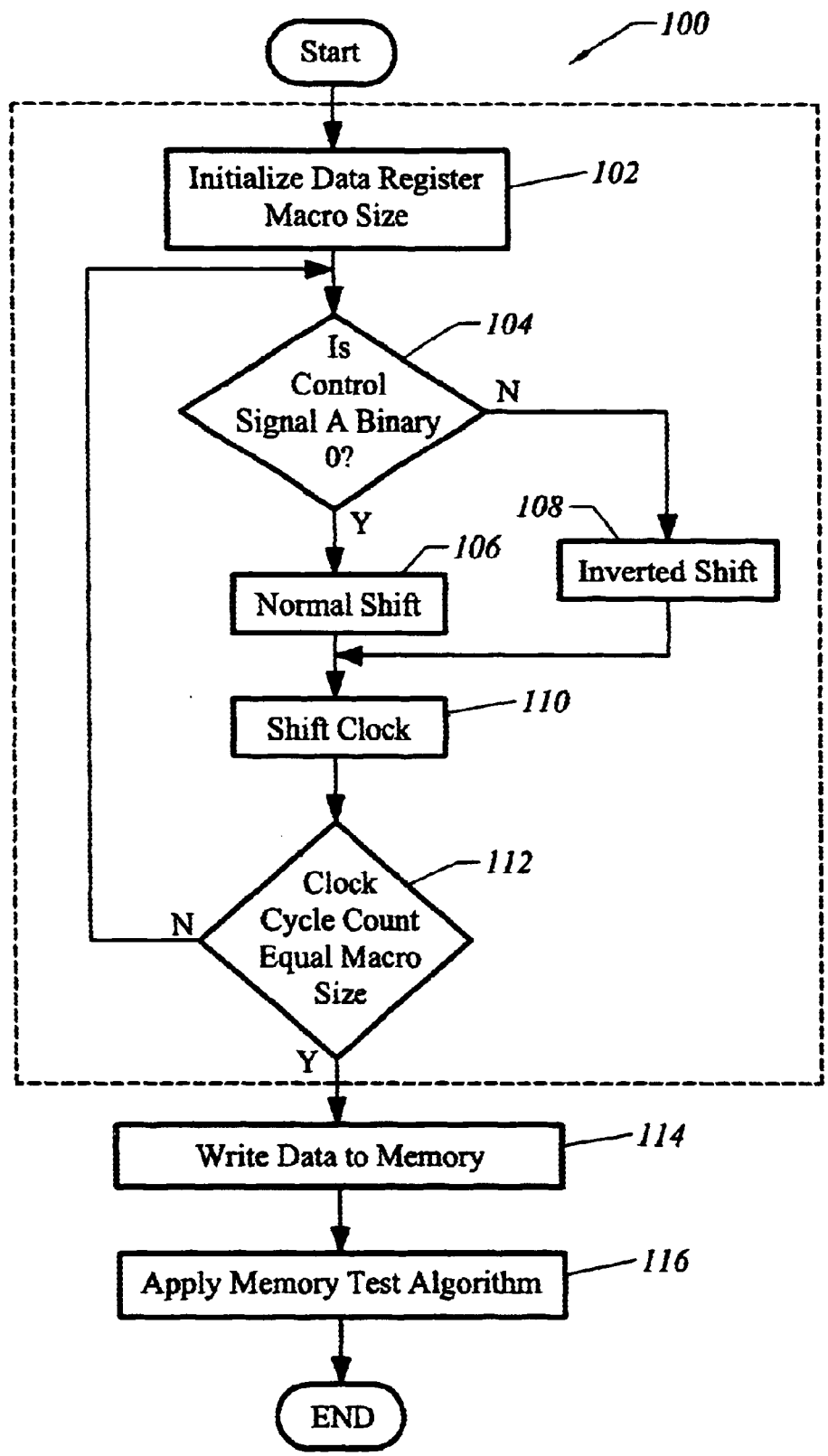
FIG. 5 is a flowchart of the present method and its respective interface with the memory test algorithm.

Referring to FIG. 5, there is shown a flowchart of the method 100 for operation of the present invention including the interface with a memory test algorithm. By way of example and not of limitation, the method of the present invention is applied to the system 50 of FIG. 3. The method 100 of the present invention re-creates a data background to test memory designs for at least one macro. The method of the present invention consists of the acts described in the processes 102, 104, 106, 108, 110 and 112. The subsequent acts, 114, 116, 118 and 120, provide for interfacing with the memory test algorithm.

At block 102, the method is initiated when the select signal from the memory test controller is switched from scan mode to test mode. At the instance of the switching from scan input mode to the test mode, the macro flip-flops retain the residual memory from the scan input. The method also determines the macro size for the macros. The method then proceeds to the process 104.

At diamond 104, it is determined whether the control signal 70 of FIG. 3 is a binary 0 or a binary 1. The control signal 70 provides the function of governing whether the same data background or its complement is regenerated. If the control signal 70 is the binary 0, the method proceeds to block 106. If the control signal is the binary 1, the method proceeds to block 108.

At block 106, the method performs a normal shift. A normal shift occurs when the scan-out signal from macro 52 is fed directly to the multiplexer 62 without being inverted by inverter 68. An example of a 'normal shift' is described below. The method then proceeds to block 110.

At block 108, the method performs an inverted shift. An inverted shift occurs when the scan-out signal from macro 52 is fed directly to the multiplexer 62 and is inverted by inverter 68. An example of a 'inverted shift' is described below. The method then proceeds to block 110.

At block 110, the shift clock is enabled. It shall be appreciated by those skilled in the art, that each flip-flop within the macro has receives an associated clocking signal, referred to herein as the "shift clock." The shift clock for each flip flop is determined by a clock controller. The ability to control the shift clock within each flip-flop with a clock controller is well known in the art. The shift clock performs the function of shifting the output from the first multiplexer 62 through the flip flops of the macro. An example of the shift clock being used in conjunction with the normal and inverted shift is described below. The method then proceeds to block 112.

At diamond 112, it is determined whether the clock cycle count is equal to the macro size. If the clock cycle count is NOT equal to the macro size, then the method returns to block 104 and continues to perform the recreation of the data background. If the clock cycle count is equal to the macro size, then the method of the present invention is completed. Thus, the data background is recreated and the subsequent memory test algorithm is performed. The method then continues to process 114.

At block 114, the method provides for writing data to memory. Writing data to the memory is accomplished by engaging the select line to operate in a test mode rather than in a normal scan in mode. The method then proceeds to block 116.

At block 116, the method provides for applying the memory test algorithm. As previously mentioned, the memory test algorithm may be a classical memory test algorithm, such as a 6N march test algorithm. Those skilled in the art will appreciate that other memory test algorithms may also be used and that the application of the 6N march test algorithms is provided as an example.

In summary, the invention provides a method for re-creating a data background by selecting between a normal shift or an inverted shift. The SRAM memory is then shifted within the flip-flops of each macro according to clocking signals of a shift clock, and the act of comparing the number of clocking signals with the macro size is then completed. Finally, the selection between a normal shift or an inverted shift is repeated until the number of clocking signals equals the macro size.

Referring to FIG. 3 and Table 1 below, there is shown the macro output generated by the invention during a normal shift. By way of example and not of limitation, the macro of Table 1 has four flops. The particular data pattern for the $W_0$ operation is shown in the first line of Table 1. The subsequent states identified as $C_1$, $C_2$, $C_3$, and $C_4$ refer to four sequential clock cycles generated by the shift clock. The flip flop output for each of these clock cycles is shown in Table 1. As described in the method above, the clock cycle count equals the macro size, hence for a macro size of four flip flops, the clock cycle count is four.

TABLE 1

MACRO OUTPUT FOR NORMAL SHIFT

| STATE | FLOP 1 | FLOP 2 | FLOP 3 | FLOP 4 |
| --- | --- | --- | --- | --- |
| $W_0$ | 0 | 1 | 0 | 1 |
| $C_1$ | 1 | 0 | 1 | 0 |
| $C_2$ | 0 | 1 | 0 | 1 |
| $C_3$ | 1 | 0 | 1 | 0 |
| $C_4$ | 0 | 1 | 0 | 1 |

In operation, the scan-out value from Flop 4, i.e. "1", of data pattern $W_0$ is not inverted and received by the first multiplexer. The first multiplexer then submits the "1" output to the second multiplexer. If the multiplexer is in test mode, the "1" is submitted to Flop 1 during the first clock cycle, $C_1$, and the remaining data pattern is shifted forward. This process is repeated for the second clock cycle, $C_2$, the third clock cycle, $C_3$, and the fourth clock cycle, $C_4$. By the fourth clock cycle, $C_4$, the data pattern for the fourth cycle is the same as the data pattern for the initial write data pattern.

Referring to FIG. 3 and Table 2 below, there is shown the output generated by the invention during an inverted shift. The particular data pattern for the $W_0$ operation is shown in the first line of Table 2. As described above, the subsequent states identified as $C_1$, $C_2$, $C_3$, and $C_4$ refer to four sequential clock cycles generated by the shift clock. The clock cycle count equals the macro size, hence for a macro size of four flip flops, the clock cycle count is four.

TABLE 2

MACRO OUTPUT FOR INVERTED SHIFT

| STATE | FLOP 1 | FLOP 2 | FLOP 3 | FLOP 4 |
| --- | --- | --- | --- | --- |
| $W_0$ | 0 | 1 | 0 | 1 |
| $C_1$ | 0 | 0 | 1 | 0 |
| $C_2$ | 1 | 0 | 0 | 1 |
| $C_3$ | 0 | 1 | 0 | 0 |
| $C_4$ | 1 | 0 | 1 | 0 |
| $W_1$ | 1 | 0 | 1 | 0 |

In operation, the scan-out value from Flop 4, i.e. "1", of data pattern $W_0$ is inverted. Recall that during the inverted shift the scan out signal from macro 52 is inverted by inverter 68. The first multiplexer then submits the inverted "0" output to the second multiplexer. If the multiplexer is in test mode, the "0" is submitted to Flop 1 during the first clock cycle, $C_1$, and the remaining data pattern is shifted forward. This process is repeated for the second clock cycle, $C_2$, the third clock cycle, $C_3$, and the fourth clock cycle, $C_4$. By the fourth clock cycle, $C_4$, the data pattern for the fourth cycle is the complement of the data pattern form the initial $W_0$ data pattern. Note that $W_1$ is the complement of $W_0$.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A system for recreating a data background to test memory designs comprising:

a macro having an input and an output;

a first multiplexer having a first input coupled to the output of said macro and a second input coupled to an inverted version of the output of said macro, said first multiplexer receiving a control signal which selects between the output of said macro and said inverted version of the output of said macro to generate a first multiplexer output; and a second multiplexer having a first input coupled to said first multiplexer output and a second input coupled to a normal scan input signal, said second multiplexer receiving a select signal which selects between said first multiplexer output and said normal scan input signal to generate a second multiplexer output which is coupled to said input of said macro.

2. The system of claim 1 further including a memory test controller configured to generate said control signal, said memory test controller configured to generate said normal scan input signal, and a memory test algorithm.

3. The system of claim 2 wherein said macro includes at least one flip flop.

4. The system of claim 3 wherein said memory test algorithm is a 6N march test algorithm.

5. The system of claim 3 further comprising a shift clock coupled to said at least one flip flop and configured to shift said first multiplexer output through said at least one flip flop.

6. A system for recreating a data background to test memory designs comprising:

a plurality of cascaded macros, each of said plurality of cascaded macros having an input and an output;

a first multiplexer having a first input coupled to the output of a last macro of said plurality of cascaded macros and a second input coupled to an inverted version of the output of said last macro, said first multiplexer receiving a control signal which selects between the output of said last macro and said inverted version of the output of said last macro to generate a first multiplexer output; and a second multiplexer having a first input coupled to said first multiplexer output and a second input coupled to a normal scan input signal, said second multiplexer receiving a select signal which selects between said first multiplexer output and said normal scan input signal to generate a second multiplexer output which is coupled to the input of a first macro of said plurality of cascaded macros.

7. The system of claim 6 further including a memory test controller configured to generate said control signal, said memory test controller configured to generate said normal scan input signal, and a memory test algorithm.

8. The system of claim 7 wherein each of said plurality of macros includes at least one flip flop.

9. The system of claim 7 further comprising a shift clock coupled to said at least one flip flop and configured to shift said first multiplexer output through said at least one flip flop.

10. The system of claim 9 wherein said memory test algorithm is a 6N march test algorithm.

11. The system of claim 7 wherein said plurality of macros comprises four macros.

12. A system for recreating a data background to test memory designs, comprising:

a macro having a scan in port and a scan out port, said scan out port configured to communicate a logic state;

a first multiplexer having a first input and a second input, said first input configured to receive said logic state from said scan out port;

an inverter configured to receive said logic state from said scan out port and configured to communicate an inverted logic state to said second input of said first multiplexer;

a control signal submitted to said first multiplexer, said control signal configured to select between said logic state or said inverted logic state to generate a first multiplexer output signal;

a second multiplexer having a first input and a second input, said first input of said second multiplexer structured to receive said first multiplexer output, and said second input structured to receive a normal scan input signal; and a select signal submitted to said second multiplexer that is configured to select between said first multiplexer output signal or said normal scan input signal, to generate a second multiplexer output signal communicated to said scan in port of said macro.

13. The system of claim 12 wherein said macro comprises a macro size having at least one flip flop.

14. A method for recreating a data background to test memory designs for a macro size defined by a plurality of flip-flops, comprising:

initializing said macro with a normal scan input;

selecting between a normal shift or an inverted shift;

performing either said normal shift or said inverted shift;

shifting memory within said flip-flops according to a number of clocking signals of a shift clock;

comparing said number of clocking signals with said macro size; and repeating said selection between a normal shift or an inverted shift until said number of clocking signals equals said macro size.

\* \* \* \* \*